(12) United States Patent
Guan et al.

(10) Patent No.: US 8,288,839 B2
(45) Date of Patent: Oct. 16, 2012

(54) TRANSIENT VOLTAGE SUPPRESSOR HAVING SYMMETRICAL BREAKDOWN VOLTAGES

(75) Inventors: Lingpeng Guan, Santa Clara, CA (US); Madhur Bobde, San Jose, CA (US); Anup Bhalla, Santa Clara, CA (US)

(73) Assignee: Alpha & Omega Semiconductor, Inc., Sunnyvale, CA (US)

( * ) Notice: Subject to any disclaimer, the term of this patent is extended or adjusted under 35 U.S.C. 154(b) by 611 days.

(21) Appl. No.: 12/433,358

(22) Filed: Apr. 30, 2009

(65) Prior Publication Data
US 2010/0276779 A1 Nov. 4, 2010

(51) Int. Cl.
*H01L 29/866* (2006.01)
(52) U.S. Cl. ........ 257/493; 257/603; 257/E29.335; 438/140; 438/379
(58) Field of Classification Search ........ 257/493, 257/497, 603, E29.335; 438/140, 379
See application file for complete search history.

(56) References Cited

U.S. PATENT DOCUMENTS

| | | | |
|---|---|---|---|
| 6,392,266 B1 * | 5/2002 | Robb et al. | 257/603 |
| 6,489,660 B1 * | 12/2002 | Einthoven et al. | 257/497 |
| 6,597,052 B2 | 7/2003 | Hurkx et al. | |
| 6,867,436 B1 * | 3/2005 | Matteson et al. | 257/603 |
| 2007/0073807 A1 | 3/2007 | Bobde | |
| 2008/0079035 A1 | 4/2008 | Bobde | |
| 2009/0045457 A1 | 2/2009 | Bobde | |
| 2011/0121429 A1 * | 5/2011 | Morillon | 257/603 |

OTHER PUBLICATIONS

J. Urresti et al., "Low Voltage TVS Devices: Design and Fabrication," IEEE 2002, pp. 257-260.
Bin Yu et al., "Punchthrough Transient Voltage Suppressor for EOS/ESD Protection of Low-voltage IC's," EOS/ESD Symposium 1995, pp. 27-33.
Ya-Chin King et al., "Punchthrough Diode as the Transient Voltage Suppressor for Low-Voltage Electronics," IEEE Transactions on Electron Devices, vol. 43, No. 11, Nov. 1996, pp. 2037-2040.

* cited by examiner

*Primary Examiner* — Mary Wilczewski
*Assistant Examiner* — Toniae Thomas
(74) *Attorney, Agent, or Firm* — Patent Law Group LLP; Carmen C. Cook

(57) ABSTRACT

A vertical transient voltage suppressing (TVS) device includes a semiconductor substrate of a first conductivity type where the substrate is heavily doped, an epitaxial layer of the first conductivity type formed on the substrate where the epitaxial layer has a first thickness, and a base region of a second conductivity type formed in the epitaxial layer where the base region is positioned in a middle region of the epitaxial layer. The base region and the epitaxial layer provide a substantially symmetrical vertical doping profile on both sides of the base region. In one embodiment, the base region is formed by high energy implantation. In another embodiment, the base region is formed as a buried layer. The doping concentrations of the epitaxial layer and the base region are selected to configure the TVS device as a punchthrough diode based TVS or an avalanche mode TVS.

23 Claims, 11 Drawing Sheets

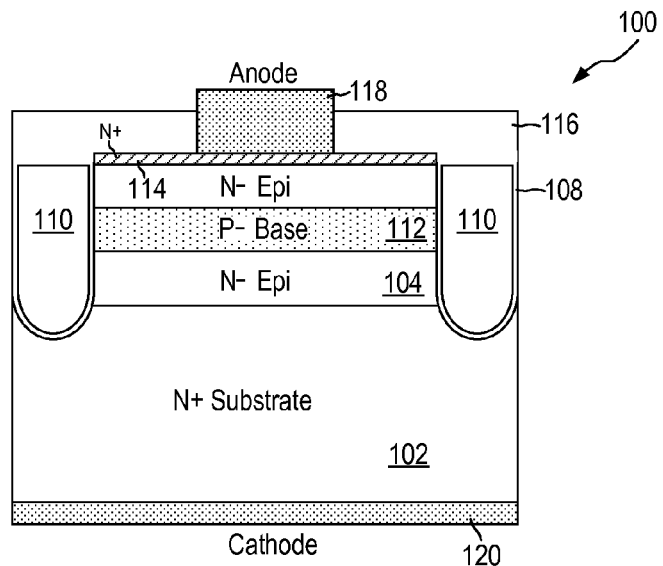
Fig. 3
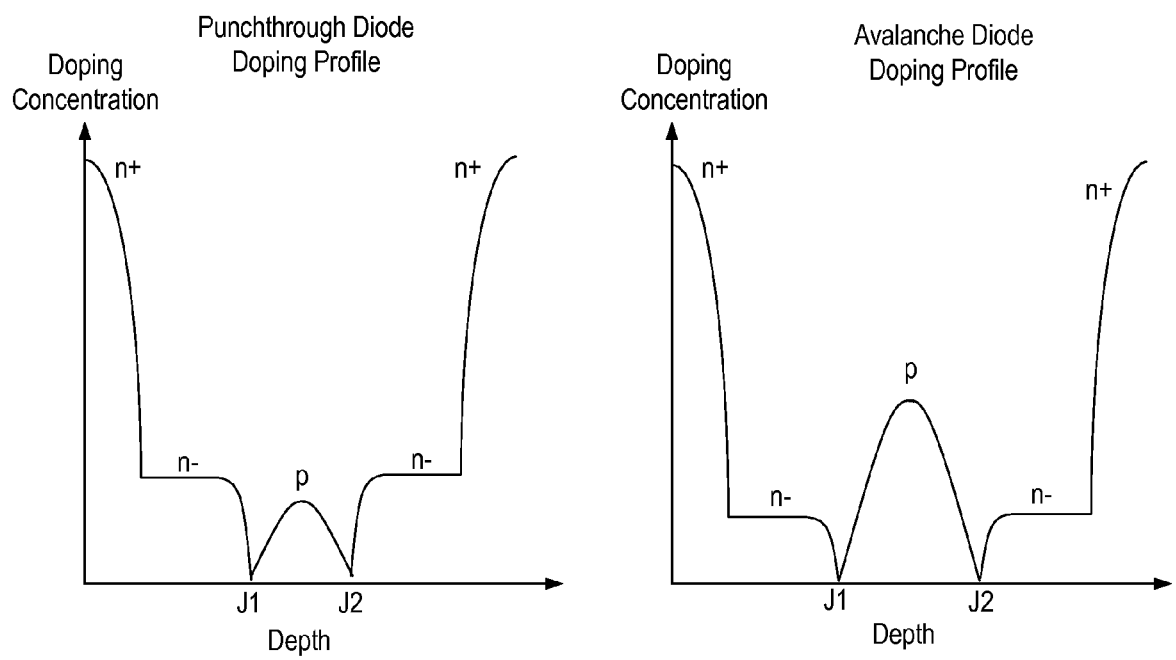
Fig. 4(a)          Fig. 4(b)

TRANSIENT VOLTAGE SUPPRESSOR HAVING SYMMETRICAL BREAKDOWN VOLTAGES

FIELD OF THE INVENTION

The invention relates to a structure and a method of fabrication of a transient voltage suppressor (TVS) and, in particular, to a structure and a method of fabrication of a vertical transient voltage suppressor (TVS) having symmetrical breakdown voltages and reduced process sensitivity.

DESCRIPTION OF THE RELATED ART

Voltages and current transients are major causes of integrated circuit failure in electronic systems. Transients are generated from a variety of sources both internal and external to the system. For instance, common sources of transients include normal switching operations of power supplies, AC line fluctuations, lightning surges, and electrostatic discharge (ESD).

Transient voltage suppressors (TVS) are commonly employed for protecting integrated circuits from damages due to the occurrences of transients or over-voltage conditions at the integrated circuit. TVS devices are either uni-directional devices or bi-directional devices. An increasing number of electronic devices require bi-directional TVS protection as these electronic devices are manufactured with components that are vulnerable to transient voltages having positive or negative voltage polarity. For instance, bi-directional TVS devices are used for protecting high-speed data lines in applications such as portable handheld devices, keypads, notebook computers, digital cameras, and portable GPS and MP3 players. FIG. 1 is a symbolic representation of a bi-directional TVS applied to protect a signal line.

There are many schemes for implementing a two-directional TVS. In most applications, a vertical structure is desired to limit die size for the TVS device. Furthermore, for low voltage applications, the punchthrough diode based TVS is commonly used. More specifically, the low voltage two-directional TVS, punchthrough diode based, is implemented using a NPN or PNP configuration with emitter-base and collector-base breakdown voltages where the doping levels of the NPN or PNP layers are optimized for punchthrough breakdown.

For instance, a punchthrough diode TVS is often characterized as a bipolar junction transistor (BJT) with a narrow and lightly doped base so that punchthrough of the lightly doped base region occurs at a lower voltage than the avalanche breakdown voltage would. A punchthrough diode based TVS is usually formed as a stacked structure of multiple doped layers, such as a four-layer structure including $n^+$-$p^+$-$p^-$-$n^+$ layers, with the $p^-$ layer being the lightly doped layer.

Conventional punchthrough diode based TVS devices have many shortcomings. First, due to fabrication process limitation, the breakdown voltage of TVS device is often not symmetrical. That is, the emitter-base and collector-base breakdown voltages of the TVS are not identical. Second, there is often a large device-to-device variation in the breakdown voltages. Typically, the stacked layers of a TVS are formed by epitaxial growth of each layer or by ion implantation of subsequent layers into an original epitaxial layer. The breakdown voltage is a function of the thickness of the epitaxial layer, the doping of the epitaxial layer and the doping of the base region. Epitaxial layers have inherent doping concentration variations. Furthermore, the thickness of the epitaxial layer, especially a relatively thin epitaxial layer, also has variations across the wafer and from wafer to wafer. As a result, variations in breakdown voltage are observed due to the epitaxial thickness variations and the doping concentration variations. Moreover, if the epitaxial layer is too thin, out-doping from the heavily doped substrate can adversely affect the doping concentration of the epitaxial layer or even the base region.

FIGS. 2(a) to 2(c) illustrate several conventional doping profiles used in implementing TVS devices. The conventional vertical TVS devices are formed with base regions having a concentration gradient (FIGS. 2(a) and (b)) or a step in the doping concentration (FIG. 2(c)). The asymmetrical doping profile in the base region is often a result of low implantation energy used to form the base region in a thin epitaxial layer. The uneven doping profiles lead to asymmetrical breakdown voltages and breakdown voltages that are sensitive to fabrication process variations.

SUMMARY OF THE INVENTION

According to one embodiment of the present invention, a vertical transient voltage suppressing (TVS) device includes a semiconductor substrate of a first conductivity type where the substrate is heavily doped, an epitaxial layer of the first conductivity type formed on the substrate where the epitaxial layer has a first thickness, and a base region of a second conductivity type implanted in the epitaxial layer where the base region is positioned in a middle region of the epitaxial layer. The base region and the epitaxial layer provide a substantially symmetrical vertical doping profile on both sides of the base region such that the breakdown voltages in both directions are symmetrical.

According to another aspect of the present invention, a method of forming a vertical transient voltage suppressing (TVS) device includes providing a semiconductor substrate of a first conductivity type where the substrate is heavily doped, forming an epitaxial layer of the first conductivity type on the substrate where the epitaxial layer having a first thickness, and forming a base region of a second conductivity type in the epitaxial layer where the base region is formed in a middle region of the epitaxial layer. The base region and the epitaxial layer provide a substantially symmetrical vertical doping profile on both sides of the base region In one embodiment, the base region is formed by high energy implant into the epitaxial layer. In another embodiment, the base region is formed as a buried layer in the middle of the epitaxial layer. In another embodiment, the epitaxial layer is very lightly doped, and a buffer layer of a first conductivity type is implanted on the top and bottom of the base region within the epitaxial layer.

The present invention is better understood upon consideration of the detailed description below and the accompanying drawings.

BRIEF DESCRIPTION OF THE DRAWINGS

FIG. 3 is a cross-sectional view of a vertical TVS device formed using an NPN structure according to one embodiment of the present invention.

FIGS. 4(a) and 4(b) illustrate two vertical doping profiles that can be achieved in TVS device 100 according to two different embodiments of the present invention.

DETAILED DESCRIPTION OF THE PREFERRED EMBODIMENTS

Figure 1:
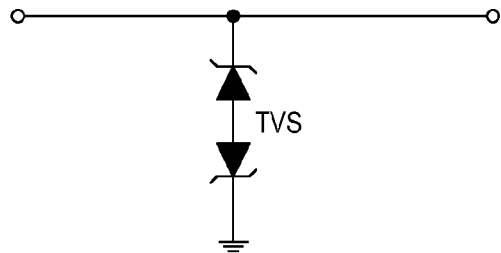
FIG. 1 illustrates a bi-directional TVS applied to protect a signal line.
Figure 2A:
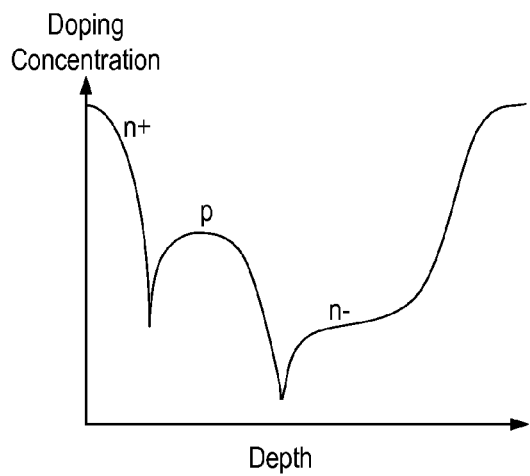
FIGS. 2(a) to 2(c) illustrate several conventional doping profiles used in implementing TVS devices.
Figure 2B:
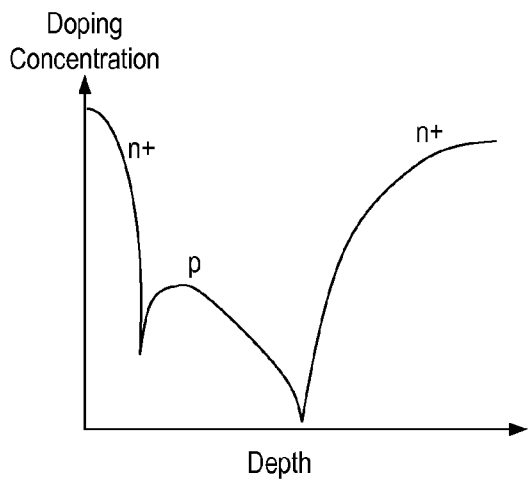
Figure 2C:
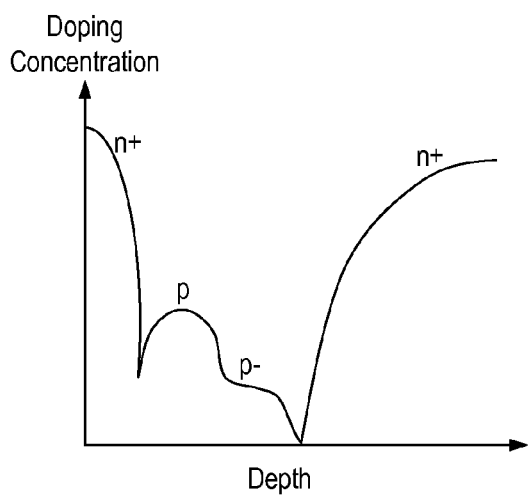

In accordance with the principles of the present invention, a punchthrough diode based or avalanche mode transient voltage suppressing (TVS) device uses a high energy base implant to form a base region in a thick epitaxial layer to realize a symmetrical NPN or PNP structure. The high energy implantation ensures that the TVS device has a symmetric base doping profile, resulting in a TVS device with symmetrical breakdown voltage. A thick epitaxial layer is used so that when the base region is completely depleted under reverse bias, the depletion layer will not reach the edge of the epitaxial layer, but will remain within the epitaxial layer instead. In this manner, variations in the thickness of the epitaxial layer will not affect the breakdown voltage of the TVS device. In an alternate embodiment, the base region is formed in the middle of the epitaxial layer using a buried layer technology to achieve the same symmetrical doping profile.

According to another aspect of the present invention, a very lightly doped epitaxial layer is used and the doping level of the epitaxial layer is modified by a buffer layer implanted in the epitaxial layer and housing the base region. The buffer layer isolates the sensitivity of the TVS device from the doping variations inherent in the epitaxial layer. The breakdown voltage of the vertical TVS thus formed becomes insensitive to variations in both the thickness and the doping concentration of the epitaxial layer. In another embodiment, the buffer layer is implanted on the top and bottom of the base region within the epitaxial layer so that the buffer layer and the base region control the breakdown voltages. Since both the buffer layer and the base region are formed by implantations, this further removes problems from the inherent doping variations in the epitaxial layer.

In the present description, an avalanche mode transient voltage suppressing device and a punchthrough diode based transient voltage suppressing device are both referred to as transient voltage suppressors (TVS). An avalanche mode TVS has doping levels optimized for avalanche breakdown in the base region where the avalanche current is amplified with the bipolar gain to realize improved clamping of the collector-to-emitter voltage. On the other hand, a punchthrough diode based TVS is characterized as a bipolar junction transistor with a narrow and lightly doped base where the doping levels are optimized for punchthrough breakdown. In particular, punchthrough of the lightly doped base region occurs at a lower voltage than the avalanche breakdown voltage would.

Both avalanche mode and punchthrough diode based TVS devices are particularly useful in low voltage applications for suppressing peak voltages in the low voltage range, such as 5 volts or below.

The breakdown voltage of a vertical TVS, whether based on avalanche or punchthrough, is a function of the doping level and the thickness of the base region in comparison to the surrounding collector and emitter regions. In punchthrough diode based TVS, the thickness and the doping level of the lightly doped base region is chosen such that the base region is completely depleted at the punchthrough voltage. More specifically, the depletion layer extends mostly into the low-doped base region and as long as the lightly doped base region is narrow, punchthrough is reached when the depletion reaches the other side of the base region. The punchthrough diode thus acts as a short circuit. If the punchthrough voltage of a device is lower than its avalanche voltage, the device will breakdown through punchthrough. If the avalanche voltage of a device is lower than its punchthrough voltage, the device will breakdown through avalanche.

FIG. 3 is a cross-sectional view of a vertical TVS device formed using an NPN structure according to one embodiment of the present invention. Referring to FIG. 3, a vertical TVS device 100 is formed on a heavily doped N+ substrate 102. A lightly doped N− epitaxial layer 104 is formed on the N+ substrate 102. A lightly doped P− base region 112 is formed by high energy ion implantation into the N− epitaxial layer 104. As thus formed, the P− base region 112 is placed in a middle region of the N− epitaxial layer 104.

In accordance with the present invention, the N− epitaxial layer 104 is made thicker than the epitaxial layer used in conventional vertical TVS devices. In particular, the N− epitaxial layer 104 has a thickness that is much greater than the thickness of the P− base region 112. In this manner, variation in the thickness of the N− epitaxial layer due to inherent epitaxial fabrication process limitations will not affect the breakdown voltage of TVS device 100.

After P− base region 112 is formed, a heavily doped N+ contact layer 114 is formed on the surface of the N− epitaxial layer 104 to form an ohmic contact. A dielectric layer 116 is used to cover and protect the semiconductor structure. An opening is formed in the dielectric layer 116 to form an anode electrode 118 for making electrical contact with the N+ contact layer 114. A cathode electrode 120 for making electrical contact with the N+ substrate 102 is also formed on the bottom surface of the substrate. Anode electrode 118 and cathode electrode 120 are typically formed of conductive materials, such as metal layers.

In the present illustration, TVS device 100 is isolated by trench isolation so that an array of identical TVS devices can be formed on the substrate or the TVS device can be formed with other devices to realize the desired protection circuit for the integrated circuit. In the present embodiment, a trench extending to the substrate is formed to isolate TVS device 100 and the trench is lined with an oxide layer 108 and filled with a polysilicon layer 110.

By using a thick lightly doped N-type epitaxial layer 104 and a high energy base implantation to form the base region 112, TVS device 100 realizes a symmetrical doping profile across the N−/P−/N− regions. FIGS. 4(*a*) and 4(*b*) illustrate two vertical doping profiles that can be achieved in TVS device 100 according to two different embodiments of the present invention. Referring FIGS. 4(*a*) and 4(*b*), the doping profile of TVS device 100 from the N+ contact layer 114 down to N+ substrate 102 is illustrated. A symmetric p-type doping is formed in the middle of the lightly doped (n−) epitaxial layer. As a result of the symmetrical profile, the breakdown voltages of TVS device 100 at the first junction J1 and the second junction J2 are the same. TVS device 100 thus realizes a symmetrical breakdown voltage characteristic.

Furthermore, the base charge of TVS device 100 is controlled only by the base region implantation and doping level of the epitaxial layer. Thus, good base charge control is realized. In FIG. 4(*a*), the p-base region is formed to have a doping concentration less than or about the same as the n− epitaxial layer. The doping profile in FIG. 4(*a*) has very light base doping and the TVS device is thus easily depleted and optimized for punchthrough breakdown. In FIG. 4(*b*), the p-base region is formed to have a doping concentration greater than the n− epitaxial layer. The doping profile in FIG. 4(*b*) has higher base doping and the TVS device is thus optimized for avalanche breakdown. The base region doping level and thickness is optimized to select the desired breakdown voltage (avalanche or punchthrough) for the TVS device.

TVS device 100 can have two operating modes. For low voltage operation, accurate breakdown voltage is obtained due to the excellent base region charge control as a result of the high energy base region implant in a thick epitaxial layer. The breakdown voltage is determined by the breakdown voltage of the collector-emitter (BVceo). In devices for higher voltage operation, the avalanche breakdown voltages at junctions J1 and J2 tend to dominate and since both junctions have the same breakdown voltage, TVS device 100 operates symmetrically for positive and negative voltage polarities.

Figure 5:
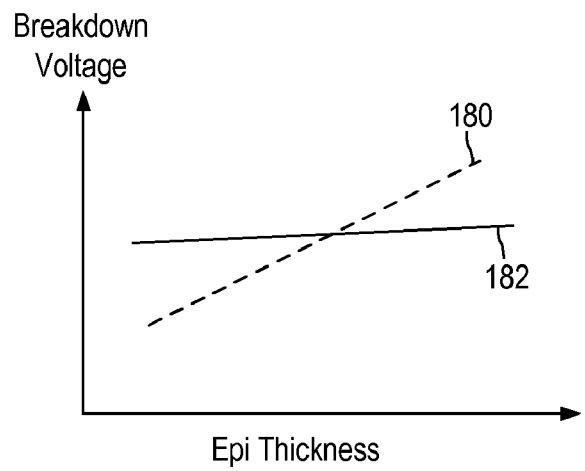
FIG. 5 illustrates the breakdown voltage vs. epitaxial thickness variation for a conventional TVS with an asymmetrical doping profile and for the TVS device of the present invention with a symmetrical doping profile and a thick epitaxial layer.

A salient feature of TVS device 100 is that the breakdown voltage is only dependent on the doping level of the epitaxial layer and the base doping control. The breakdown voltage of TVS device 100 is insensitive to thickness variations of the epitaxial layer because the epitaxial layer has been made sufficiently thick enough that the depletion region will not reach the substrate despite the variations in the epitaxial layer thickness. FIG. 5 illustrates the breakdown voltage vs. epitaxial thickness variation for a conventional TVS with an asymmetrical doping profile and for the TVS device of the present invention with a symmetrical doping profile and a thick epitaxial layer. Referring to FIG. 5, for the conventional TVS with an asymmetrical doping profile (curve 180), the breakdown voltage is a function of the thickness of the epitaxial layer. Thus, any variation in the epitaxial thickness due to fabrication process limitations will result in variations in the breakdown voltage. However, for the TVS device of the present invention having a symmetrical doping profile (curve 182) and a thick enough epitaxial layer, the breakdown voltage becomes insensitive to the thickness of the epitaxial layer. The TVS device of the present invention is thus more robust and is not sensitive to fabrication process variations.

Figure 6:
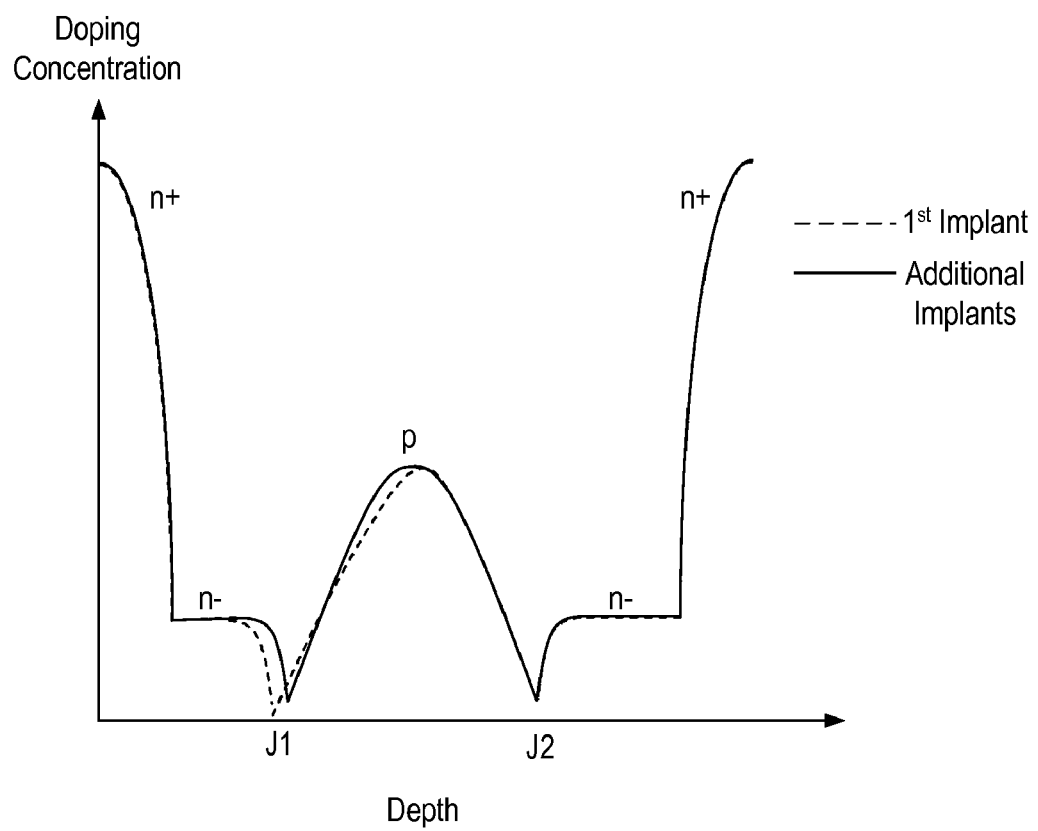
FIG. 6 illustrates the doping profiles of a TVS device when two high energy ion implantation steps are used to form the base region according to one embodiment of the present invention.

In the above described embodiment, P− base region 112 is described as being formed by a high energy ion implantation process. In one embodiment, the implant energy used is on the order of 1000 keV. The high energy implantation into the thick epitaxial layer has the advantage of achieving a symmetric doping profile. Furthermore, in one embodiment, a single high energy ion implantation step is used. In another embodiment, the P− base region is formed by two or more ion implantation steps. Multiple implantation steps can be used to improve the symmetry of the doping profile. Thus, in one embodiment, at least two high energy implantation steps are performed as shown in FIG. 6 to achieve the desired symmetrical doping profile. The dotted line in FIG. 6 illustrates the doping profile as a result of the first ion implantation step to form the base region. The base region may have a slight skew from the first ion implantation step. The solid line in FIG. 6 illustrates the doping profile as a result of additional implantation step(s) to improve the symmetry of the base doping profile. The additional implant(s) may be either n type or p type, depending on which is needed to improve the doping and breakdown symmetry.

FIGS. 7(*a*) to 7(*d*) illustrate the fabrication process for forming the TVS device of FIG. 3 according to one embodiment of the present invention. Referring to FIG. 7(*a*), the fabrication process starts with the N+ substrate 102 as the starting material. An epitaxial process is carried out to grow the N-type epitaxial layer 104. N-type epitaxial layer 104 is lightly doped ("N− Epi") and can have a thickness of about 5-6 μm. In accordance with the present invention, the N− Epi layer 104 has a thickness that is greater than the thickness used in conventional vertical TVS devices.

When TVS device 100 is formed on an integrated circuit together with other devices, isolation of the TVS device is necessary. FIG. 7(*b*) illustrates a trench isolation structure being used to isolate the TVS device 100 formed on N+ substrate 102 and N− Epi 104. The use of the trench isolation structure in FIG. 7(*b*) is illustrative only and in other embodiments, other isolation structures can be used. The exact nature of the isolation structure is not critical to the practice of the present invention. The TVS device of the present invention can be constructed using various types of isolation structures, presently known or to be developed. Referring to FIG. 7(*b*), trenches 106 are formed in N− Epi 104 and extends partially into N+ substrate 102. The trenches define the area which the TVS device is to be formed. Trenches 106 are lined with an oxide layer 108 and are then filled with a polysilicon layer 110. The polysilicon layer 110 is etched back to be partially recessed from the top surface of N− Epi 104.

Referring to FIG. 7(*c*), an ion implantation process to form the P− Base region 112 is carried out. The P− Base implantation is a high energy implantation to place the P-type implants in the middle of the N− Epi 104. In one embodiment, to form a punchthrough diode based TVS, the P− base implantation is carried out at an implant energy of 1000 keV, at a dose of $3 \times 10^{13}$ atoms/cm$^2$ and using Boron as the P-type dopants. In another embodiment, to form an avalanche breakdown TVS, an implant dose of $9 \times 10^{13}$ atoms/cm$^2$ is used instead. According to an alternate embodiment of the present invention, a second P− base implantation is performed to improve the symmetry of the doping profile. The second P− base implantation can be performed before or after the drive-in of the first P− base implantation step. The second P− base implantation step can be performed using the same or different process parameters, such as energy and dose.

Figure 7A:
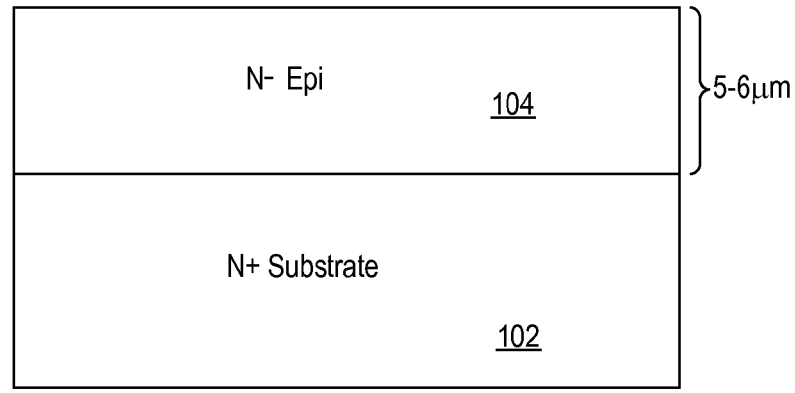
FIGS. 7(a) to 7(d) illustrate the fabrication process for forming TVS device of FIG. 3 according to one embodiment of the present invention.
Figure 7B:
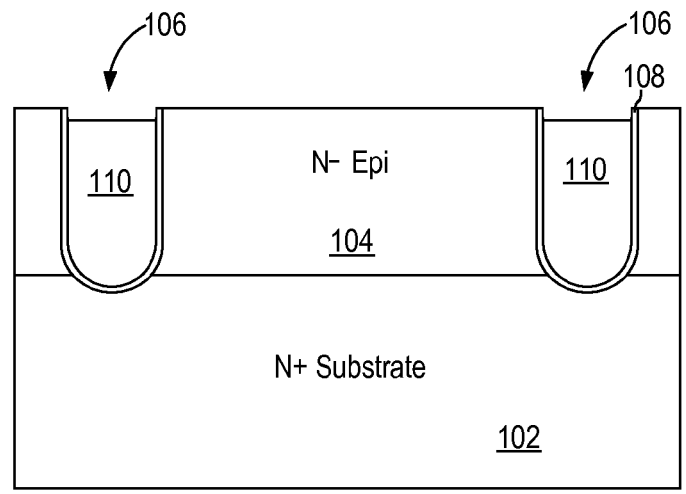
Figure 7C:
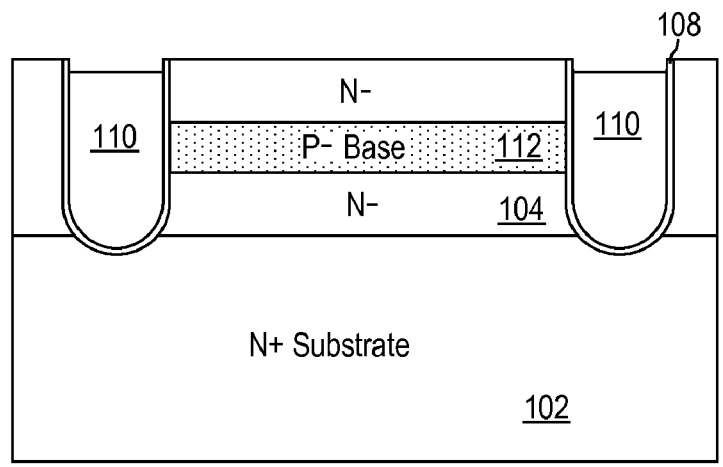
Figure 7D:
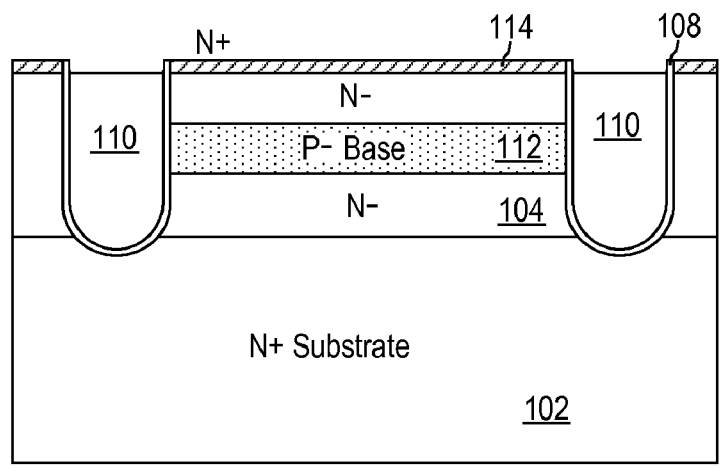

Referring to FIG. 7(d), after P-base formation, an ion implantation process is carried out to form the N+ contact layer 114 on top of N− Epi 104. The N+ contact layer 114 is heavily doped and is formed only on the surface of N− Epi 104 for making ohmic contact to the N− Epi. In one embodiment, the N+ contact implantation is carried out at an implant energy of 80 keV, at a dose of $4 \times 10^{15}$ atoms/cm$^2$, and using Arsenic as the N-type dopants. Subsequently, as shown in FIG. 3, a dielectric layer 116 is formed on the entire semiconductor structure and an opening is made in the dielectric layer to allow anode electrode 118 to be formed to make electrical contact to the N+ contact layer 114. Cathode electrode 120 is formed on the bottom of N+ substrate 102.

TVS device 100 thus formed has many advantages over conventional TVS devices. First, with the use of a thick epitaxial layer and a high energy base implantation, the base region is formed centered within the epitaxial layer. In particular, the thick epitaxial layer ensures that the base region will not be formed near the edges of or out of the epitaxial layer. Typical variations in the thickness of the epitaxial layer will not negatively affect the doping profile or the breakdown voltage characteristics. A symmetrical doping profile is ensured over process variations. Second, the high energy implantation used to form the P− base region ensures a precise and more symmetrical doping profile. A second implantation can also be carried out to enhance the symmetry of the doping profile. Lastly, the breakdown voltage of the TVS device is dependent only on the doping level of the base region and the doping level of the epitaxial layer and thus the breakdown voltage can be well controlled.

Alternate Embodiments

Figure 8:
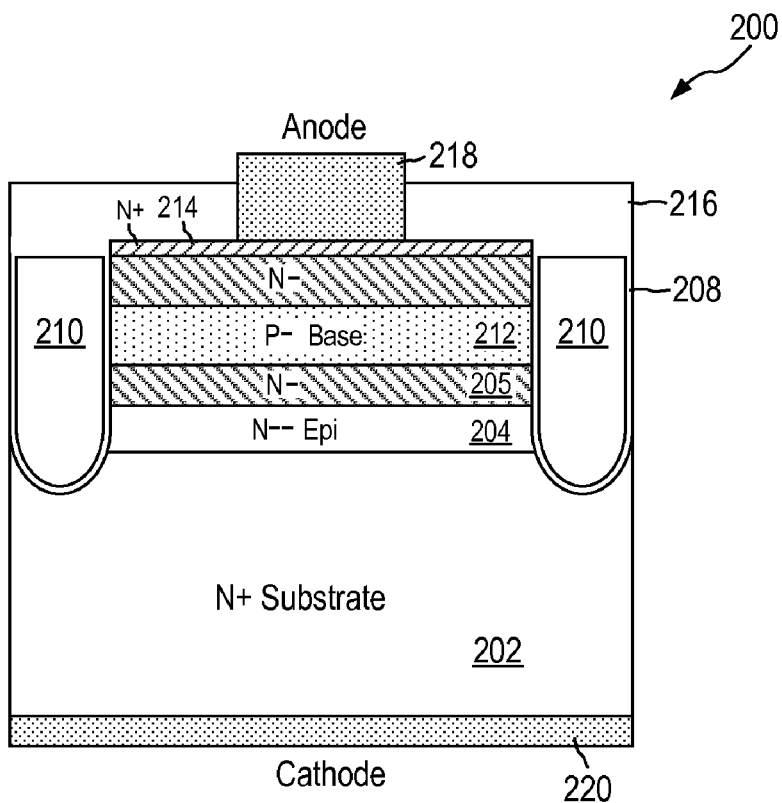
FIG. 8 is a cross-sectional view of a vertical TVS device formed using an NPN structure according to a first alternate embodiment of the present invention.

In another embodiment, a very lightly doped epitaxial layer is used and the doping level of the epitaxial layer is modified by a buffer layer formed in the epitaxial layer and housing the base region. FIG. 8 is a cross-sectional view of a vertical TVS device formed using an NPN structure according to a first alternate embodiment of the present invention. Referring to FIG. 8, TVS device 200 has a similar basic structure as TVS device 100 of FIG. 3 and like elements are given like reference numerals. However, TVS device 200 is built using a very lightly doped N-type epitaxial layer (N−− Epi) 204. A lightly doped N-type buffer layer 205 is formed by ion implantation in the N−− Epi 204. The P− base region 212 of TVS device 200 is formed in the middle of the N− buffer layer 205. As thus formed, the doping level of the N− buffer layer 205 dominates and the background doping of the N−− Epi 204 becomes insignificant. The remaining structure of TVS device 200 is constructed in the same manner as TVS device 100 of FIG. 3. An N+ contact layer 214 is formed on the top surface of N−− Epi layer 204. An anode electrode 218 is formed in electrical contact with the N+ contact layer 214 through openings in the dielectric layer 216, and a cathode electrode is formed in electrical contact with the N+ substrate 202. Polysilicon-filled trench isolation structures 208, 210 can be used to isolate TVS device 200 from other devices formed on the integrated circuit. Because of the N−− Epi 204 between the bottom of the N− buffer layer 205 and the N+ substrate, the vertical doping profile of TVS device 200 is not perfectly symmetrical from N+ contact layer 214 to N+ substrate 202. However, the vertical doping profile is still substantially symmetrical immediately about the P− base 212, i.e., from top portion of N− buffer layer 205, through P− base 212, to bottom portion of N− buffer layer 205. Importantly, the doping concentrations of N− buffer layer 205 and P− base 212 are chosen so that the breakdown voltages of TVS device 200 are still symmetrical.

TVS device 200 realizes an additional advantage in that the N− buffer layer resolves the sensitivity of the TVS device to the doping variations inherent in the epitaxial layer. Implantations are highly controlled and have very little variation in their doping concentrations and depths, as opposed to epitaxially grown layers which typically display a great deal of variation in their doping concentrations and thicknesses. The breakdown voltage of vertical TVS device 200 becomes insensitive to variations in both the thickness and the doping concentration of the epitaxial layer. TVS device 200 is thus more robust than conventional TVS devices.

Figure 9:
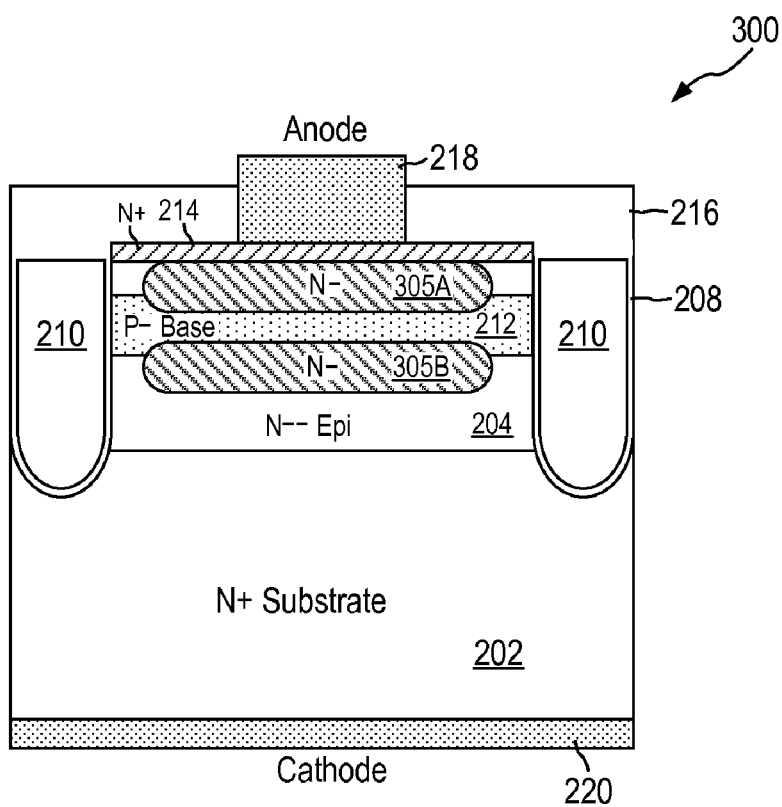
FIG. 9 is a cross-sectional view of a vertical TVS device formed using an NPN structure according to a second alternate embodiment of the present invention.

FIG. 9 is a cross-sectional view of a vertical TVS device formed using an NPN structure according to a second alternate embodiment of the present invention. TVS device 300 in FIG. 9 illustrates another method for forming the N− buffer layer. Like elements in FIGS. 8 and 9 are given like reference numerals to simplify the discussion. Referring to FIG. 9, TVS device 300 uses a very lightly doped epitaxial layer 204 (N−− Epi) and an N− buffer layer is formed as two separate doped regions 305A and 305B to bound the P− Base region 212. N− buffer layers 305A and 305B are more heavily doped than the N−− Epi 204. N− doped regions 305A and 305B are spaced apart from the trench isolation and do not extend to the full width of the P− base region 212. As thus constructed, the main semiconductor action occurs at the junction between the top N− buffer layer 305A and the P− Base region 212 and the junction between the P− Base region 212 and the bottom N− buffer layer 305B.

Similar to TVS device 200 of FIG. 8, TVS device 300 is insensitive to the doping level and the thickness of the N−− Epi 204. Rather, the breakdown voltage of TVS device 300 is a function only of the thickness and doping levels of the N− buffer layers 305A, 305B and the P− Base region 212 which can be well controlled. Furthermore, it is known that the breakdown voltage in a transistor is usually distorted in the areas proximate the trench isolation structures (210, 208). TVS device 300 realize another advantage in that N− buffer layers 305A and 305B are pulled away from the trench isolation so as to force the breakdown to occur in the lateral center of the base region, away from the trench isolation structures, so that the breakdown voltage is uniform and controlled.

Figure 10A:
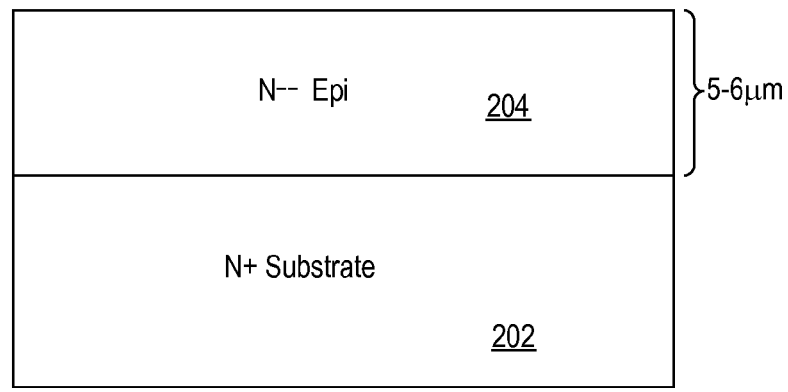
FIGS. 10(a) to 10(d) illustrate the fabrication process for forming the TVS device of FIG. 9 according to one embodiment of the present invention.
Figure 10B:
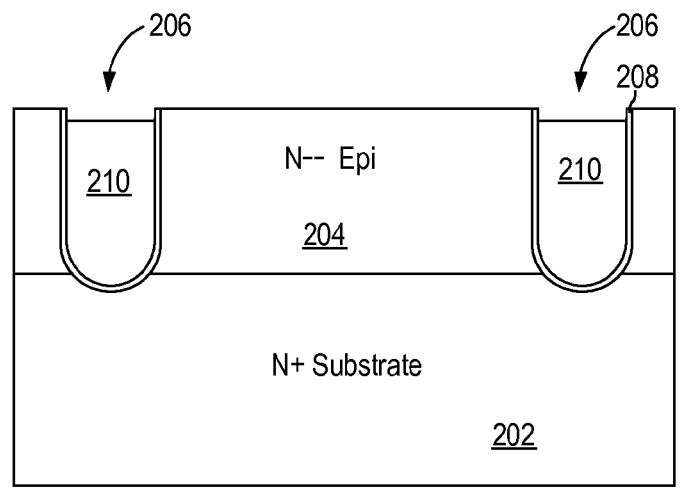

FIGS. 10(a) to 10(d) illustrate the fabrication process for forming the TVS device of FIG. 9 according to one embodiment of the present invention. Referring to FIG. 10(a), the fabrication process starts with the N+ substrate 202 as the starting material. An epitaxial process is carried out to grow the very lightly doped N−− epitaxial layer 204. N−− epitaxial layer 204 has a thickness of about 5-6 μm. In accordance with the present invention, the N−− Epi layer 204 has a thickness that is greater than the thickness used in conventional vertical TVS devices. FIG. 10(b) illustrates the formation of a trench isolation structure in TVS device 300. Trenches 206 are formed in N−− Epi 204 and extends partially into N+ substrate 202. Trenches 206 are lined with an oxide layer 208 and are then filled with a polysilicon layer 210. The polysilicon layer 210 is etched back to be partially recessed from the top surface of N−− Epi 204.

At this point, the TVS device 200 of FIG. 8 can be formed by performing an ion implantation step to form the N− buffer layer 205 and then the processing steps in FIGS. 7(c) and 7(d) are carried out to complete the TVS device. The P− base region 212 is of course formed in the middle of the implanted N− buffer layer 205.

Figure 10C:
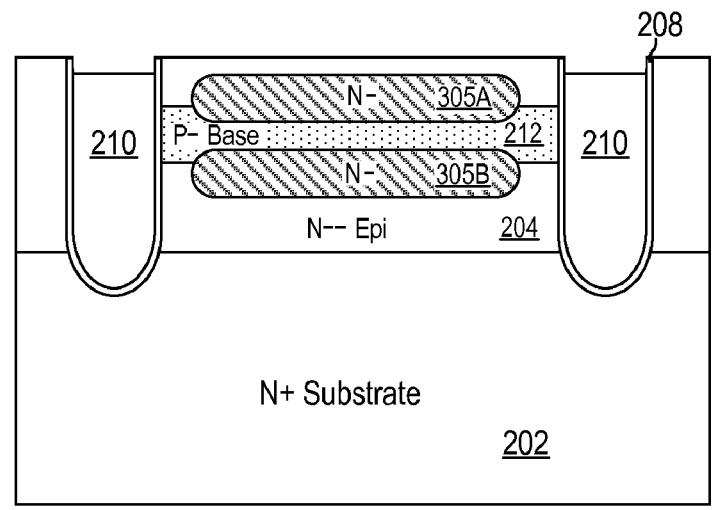

Referring now to FIG. 10(c), to form TVS device 300 of FIG. 9, an ion implantation process to form the P− Base region 212 is carried out. The P− Base implantation is a high energy implantation to place the P-type implants in the middle of the N−− Epi 204. In one embodiment, the P− base implantation is carried out at an implant energy of 1000 keV, at a dose of $5 \times 10^{13}$ atoms/cm$^2$, and using Boron as the P-type dopants. In some embodiments, a second P− base implantation is performed to improve the symmetry of the doping profile. After the P− base implantation, two N-type ion implantations are carried out to form the N− buffer layers 305A and 305B. The two N-type implantations are carried out using different implant energies to place the N-type regions at the top and bottom junctions of the P− base region 212. In one embodiment, the N− base implantations are carried out at an implant energy of 2500 keV for the bottom buffer layer 305B and 600 keV for the top buffer layer 305A, at a dose of $7 \times 10^{13}$ atoms/cm$^2$, and using Phosphorus as the N-type dopants. After the implantation steps, a heat treatment at 1100° C. is carried out to anneal the implanted regions to form the diffusion regions as shown in FIG. 10(c).

Figure 10D:
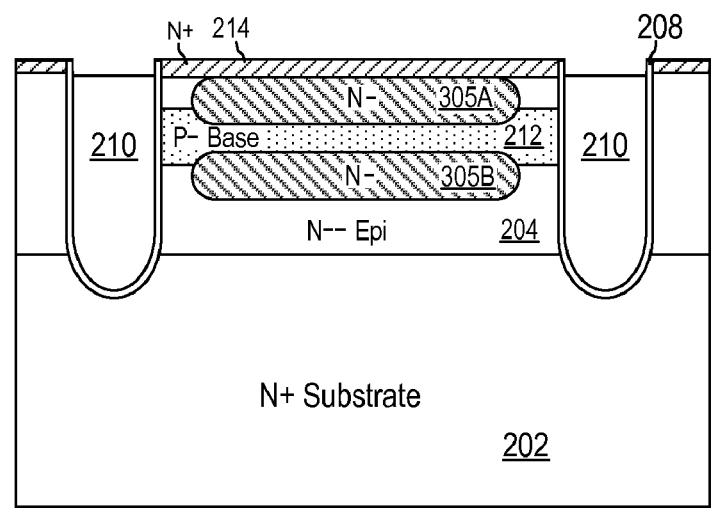

Referring to FIG. 10(d), after P-base and N− buffer layer formation, an ion implantation process is carried out to form the N+ contact layer 214 on top of N−− Epi 204. The N+ contact layer 214 is heavily doped and is formed only on the surface of N−− Epi 204 for making ohmic contact to the N−− Epi. In one embodiment, the N+ contact implantation is carried out at an implant energy of 80 keV, at a dose of $4 \times 10^{15}$ atoms/cm$^2$, and using Arsenic as the N-type dopants. Subsequently, as shown in FIG. 9, a dielectric layer 216 is formed on the entire semiconductor structure and an opening is made in the dielectric layer to allow anode electrode 218 to be formed to make electrical contact to the N+ contact layer 214. Cathode electrode 220 is formed on the bottom of N+ substrate 202.

PNP Transistors

Figure 11:
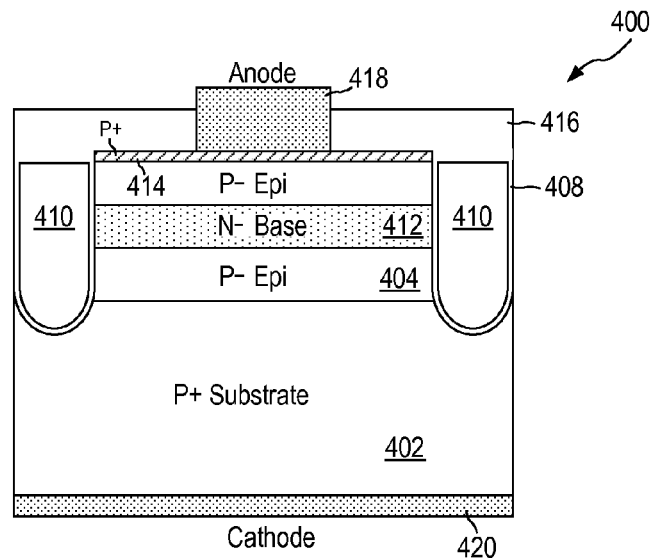
FIG. 11 is a cross-sectional view of a vertical TVS device formed using a PNP structure according to one embodiment of the present invention.
Figure 12:
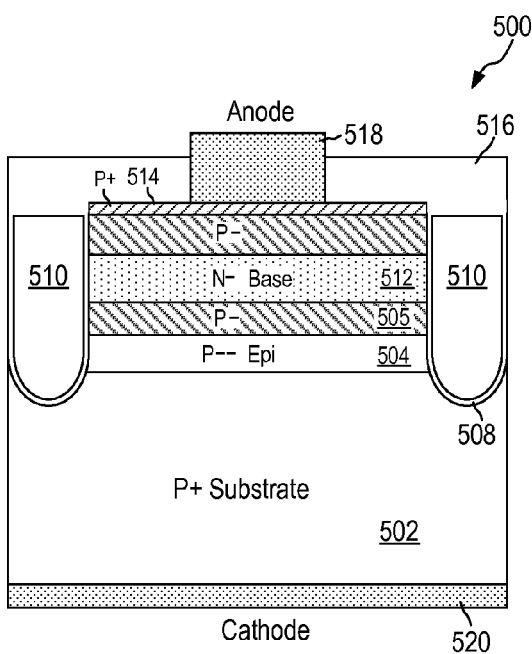
FIG. 12 is a cross-sectional view of a vertical TVS device formed using a PNP structure according to a first alternate embodiment of the present invention.
Figure 13:
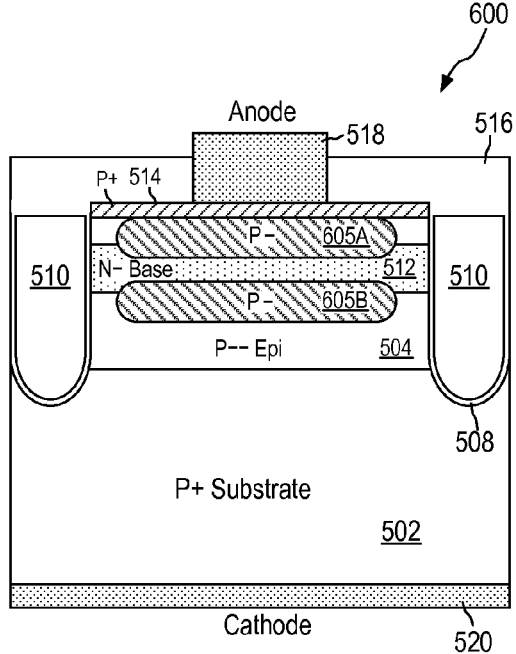
FIG. 13 is a cross-sectional view of a vertical TVS device formed using a PNP structure according to a second alternate embodiment of the present invention.

In the above-described embodiments, symmetrical NPN TVS devices are formed. The TVS devices of the present invention can also be formed using a symmetrical PNP structure, as shown in FIGS. 11, 12 and 13. In one embodiment, the symmetrical PNP TVS devices are formed using the same processing steps described above except with the use of opposite polarity materials and dopants. That is, the N− base region 412 or 512 is formed using a high energy implantation as described above with reference to the NPN structure. Trench isolation structures 408, 410, 508, 510 isolate the TVS devices 400, 500, 600. Dielectric layers 416, 516 allow anodes metals 418, 518 to make contact to contact heavily doped regions 414, 514. Cathode metal layers 420, 520 make contact to the heavily doped P+ substrate 402, 502. According to another aspect of the present invention, the N− base region 412, 512 of the PNP TVS device is formed as an N-type buried layer instead of using ion implantation.

For example, when a buried layer is used in TVS device 400 of FIG. 11, the P− Epi layer 404 is formed halfway, then an N-type implantation is carried out to implant the N− base region into the half-way formed P− Epi layer. Finally, the remaining P− Epi layer 404 is formed. Subsequent heat treatment forms an N-type buried layer in the middle of the P− Epi layer as the N− base region 412 (FIG. 11). The same buried layer process can be applied to TVS devices 500 and 600 of FIGS. 12 and 13. In those cases, the very lightly doped P−− Epi layer 504 is formed halfway and then an N-type implantation is carried out to implant the N− base region 512. The remaining P−− Epi layer 504 is then formed. TVS device 500 includes a P− buffer layer 505 implanted in the very lightly doped P-Epi layer 504. TVS device 600 includes two P− buffer layers 605A and 605B bounding the N− Base region 512 and spaced apart from the trench isolation structures.

The buried layer fabrication process can also be used to form the P− Base region 112, 212 in the NPN type TVS devices described above. Basically, the base region in the NPN or PNP TVS device of the present invention can be formed using one or more high energy ion implantation or using buried layer fabrication processes.

Figure 14:
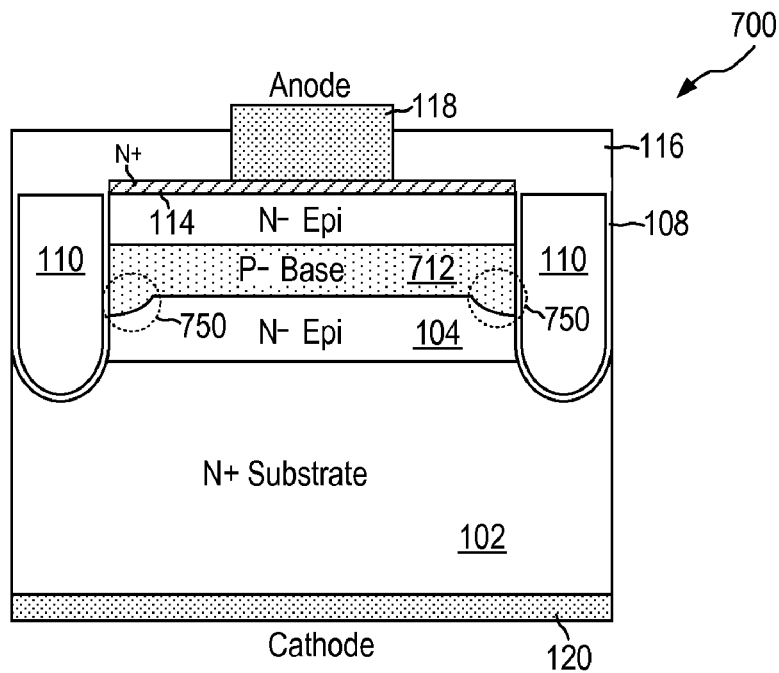
FIG. 14 is a cross-sectional view of a vertical TVS device formed using an NPN structure according to a third alternate embodiment of the present invention.
Figure 15:
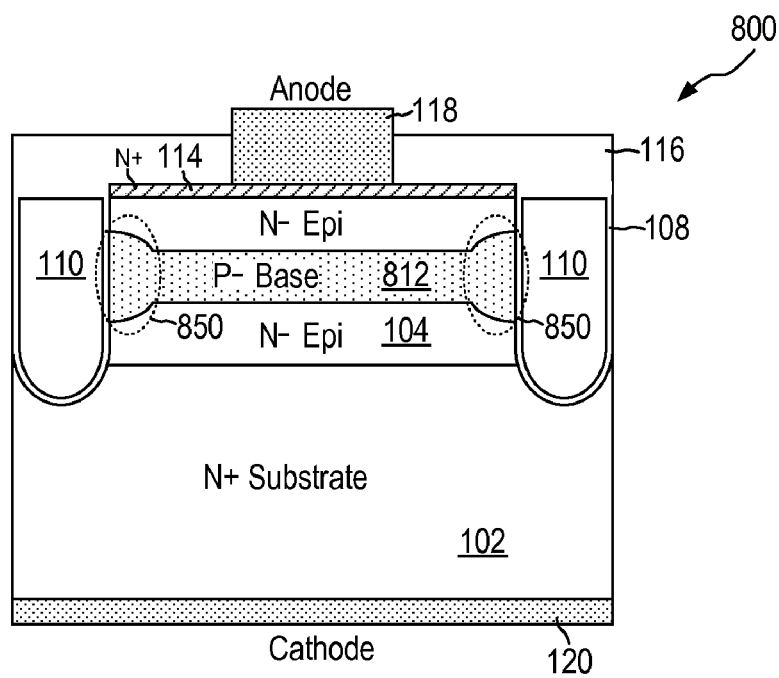
FIG. 15 is a cross-sectional view of a vertical TVS device formed using an NPN structure according to a fourth alternate embodiment of the present invention.

According to alternate embodiments of the present invention, to alleviate the electric field distortion near the edges of the isolation structures, the P− Base region is enlarged at the trench isolation edges so as to prevent low breakdown voltage at the interface between the silicon epitaxial layer and the trench isolation. FIG. 14 is a cross-sectional view of a vertical TVS device formed using an NPN structure according to a third alternate embodiment of the present invention. Referring to FIG. 14, TVS device 700 has a similar basic structure as TVS device 100 of FIG. 3 and like elements are given like reference numerals. In TVS device 700, the P− base region 712 is formed with additional p-type implantations 750 at the edges of the trench isolation structures 108, 110 to form enlarged P− Base portions. In the present embodiment, the enlarged P− Base portions 750 are provided at only the bottom surface of the P− Base region 712. In an alternate embodiment shown in FIG. 15, the P− Base region 812 is formed with enlarged P− Based portions 850 at both the top and the bottom surfaces of the P− Base region 812.

Figure 16:
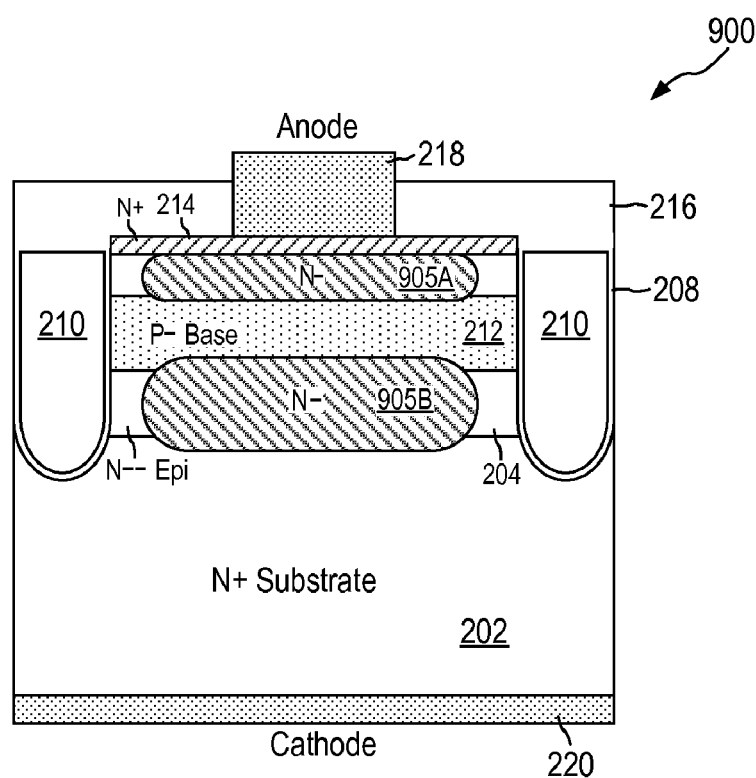
FIG. 16 is a cross-sectional view of a vertical TVS device formed using an NPN structure according to a fifth alternate embodiment of the present invention.

Returning to FIG. 9, in TVS device 300, the N− doped regions 305A and 305B bounding the P− Base region 212 are shown as having equal thickness "d". In other embodiments, the two doped regions can be formed so that the bottom doped region reaches the substrate, as shown in FIG. 16. FIG. 16 is a cross-sectional view of a vertical TVS device formed using an NPN structure according to a fifth alternate embodiment of the present invention. Referring to FIG. 16, TVS device 900 has a similar basic structure as TVS device 300 of FIG. 9 and like elements are given like reference numerals. In TVS device 900, the bottom N− buffer region 905B is formed such that it reaches the N+ substrate 202. The top N− buffer layer 905A is largely the same as the top N− buffer layer 305A of FIG. 9. This embodiment has the additional advantage of entirely bypassing the epitaxial layer 204 and its inherent doping variations.

Figure 17:
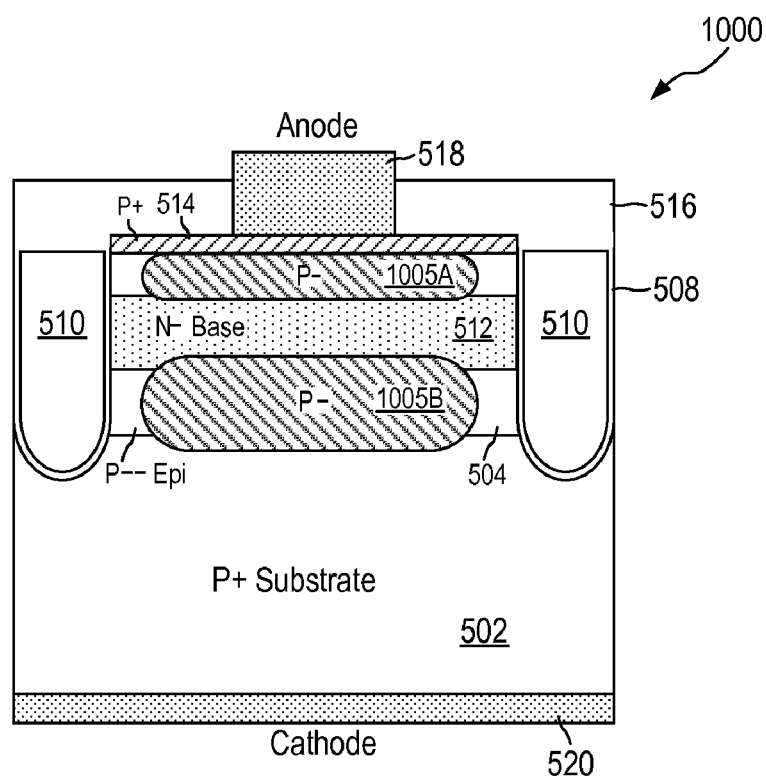
FIG. 17 is a cross-sectional view of a vertical TVS device formed using a PNP structure according to a third alternate embodiment of the present invention.

The same structure can also be applied to an PNP type TVS, as shown in FIG. 17. FIG. 17 is a cross-sectional view of a vertical TVS device formed using an PNP structure according to a third alternate embodiment of the present invention. Referring to FIG. 17, TVS device 1000 has a similar basic structure as TVS device 600 of FIG. 13 and like elements are given like reference numerals. In TVS device 1000, bottom N− buffer region 1005B is formed such that it reaches the P+ substrate 502. The top N− buffer region 1005A is largely the same as top N− buffer region 605A of FIG. 13.

The above detailed descriptions are provided to illustrate specific embodiments of the present invention and are not intended to be limiting. Numerous modifications and variations within the scope of the present invention are possible. The present invention is defined by the appended claims.

We claim:

1. A vertical transient voltage suppressing (TVS) device, comprising:
   a semiconductor substrate of a first conductivity type, the substrate being heavily doped;
   an epitaxial layer of the first conductivity type formed on the substrate, the epitaxial layer having a first thickness; and a base region of a second conductivity type implanted in the epitaxial layer, the base region being positioned in a middle region of the epitaxial layer, wherein the base region and the epitaxial layer provide a substantially symmetrical vertical doping profile on both sides of the base region; and wherein the base region and the epitaxial layer have doping concentrations selected to cause the base region to breakdown through avalanche.

2. The vertical TVS device of claim 1, further comprising:
one or more trench isolation structures formed in the epitaxial layer and partially in the semiconductor substrate, the trench isolation structures surrounding a portion of the base region and a portion of the epitaxial layer to isolate the TVS device.

3. The vertical TVS device of claim 2, wherein the base region comprises enlarged portions at edges of the base region adjacent the trench isolation structures.

4. The vertical TVS device of claim 1, wherein the first conductivity type comprises N-type conductivity and the second conductivity type comprises P-type conductivity.

5. The vertical TVS device of claim 1, wherein the first conductivity type comprises P-type conductivity and the second conductivity type comprises N-type conductivity.

6. The vertical TVS device of claim 1, wherein the base region has a second thickness much less than the first thickness.

7. The vertical TVS device of claim 1, wherein the first thickness of the epitaxial layer is at least 5 μm.

8. The vertical TVS device of claim 1, wherein the epitaxial layer comprises a very lightly doped epitaxial layer and the TVS device further comprises:
a second doped region of the first conductivity type formed in the epitaxial layer, the second doped region being lightly doped but more heavily doped than the epitaxial layer, the base region being formed in a middle region of the second doped region.

9. The vertical TVS device of claim 1, wherein the epitaxial layer comprises a very lightly doped epitaxial layer and the TVS device further comprises:
a bottom doped region of the first conductivity type formed at a bottom junction between the base region and the epitaxial layer; and a top doped region of the first conductivity type formed at a top junction between the base region and the epitaxial layer and opposite the bottom junction, wherein the bottom and top doped regions are lightly doped but more heavily doped than the epitaxial layer, a portion of each of the bottom and top doped regions lying in the base region and another portion lying in the epitaxial layer.

10. The vertical TVS device of claim 9, further comprising:
one or more trench isolation structures formed in the epitaxial layer and partially in the semiconductor substrate, the trench isolation structures surrounding a portion of the base region and a portion of the epitaxial layer to isolate TVS device, wherein the top and bottom doped regions are spaced apart from the one or more trench isolation structures.

11. The vertical TVS device of claim 9, wherein the bottom doped region reaches the substrate.

12. A vertical transient voltage suppressing (TVS) device, comprising:
a semiconductor substrate of a first conductivity type, the substrate being heavily doped;

an epitaxial layer of the first conductivity type formed on the substrate, the epitaxial layer having a first thickness;

a base region of a second conductivity type implanted in the epitaxial layer, the base region being positioned in a middle region of the epitaxial layer; and one or more trench isolation structures formed in the epitaxial layer and partially in the semiconductor substrate, the trench isolation structures surrounding a portion of the base region and a portion of the epitaxial layer to isolate the TVS device, wherein the base region and the epitaxial layer provide a substantially symmetrical vertical doping profile on both sides of the base region.

13. The vertical TVS device of claim 12, wherein the base region and the epitaxial layer have doping concentrations selected to cause the base region to breakdown through punchthrough.

14. The vertical TVS device of claim 12, wherein the base region and the epitaxial layer have doping concentrations selected to cause the base region to breakdown through avalanche.

15. The vertical TVS device of claim 12, wherein the base region comprises enlarged portions at edges of the base region adjacent the trench isolation structures.

16. The vertical TVS device of claim 12, wherein the first conductivity type comprises N-type conductivity and the second conductivity type comprises P-type conductivity.

17. The vertical TVS device of claim 12, wherein the first conductivity type comprises P-type conductivity and the second conductivity type comprises N-type conductivity.

18. The vertical TVS device of claim 12, wherein the base region has a second thickness much less than the first thickness.

19. The vertical TVS device of claim 12, wherein the first thickness of the epitaxial layer is at least 5 μm.

20. The vertical TVS device of claim 12, wherein the epitaxial layer comprises a very lightly doped epitaxial layer and the TVS device further comprises:
a second doped region of the first conductivity type formed in the epitaxial layer, the second doped region being lightly doped but more heavily doped than the epitaxial layer, the base region being formed in a middle region of the second doped region.

21. The vertical TVS device of claim 12, wherein the epitaxial layer comprises a very lightly doped epitaxial layer and the TVS device further comprises:
a bottom doped region of the first conductivity type formed at a bottom junction between the base region and the epitaxial layer; and a top doped region of the first conductivity type formed at a top junction between the base region and the epitaxial layer and opposite the bottom junction, wherein the bottom and top doped regions are lightly doped but more heavily doped than the epitaxial layer, a portion of each of the bottom and top doped regions lying in the base region and another portion lying in the epitaxial layer.

22. The vertical TVS device of claim 21, wherein the top and bottom doped regions are spaced apart from the one or more trench isolation structures.

23. The vertical TVS device of claim 21, wherein the bottom doped region reaches the substrate.

* * * * *